(12) United States Patent
Adamec

(10) Patent No.: US 6,452,175 B1
(45) Date of Patent: Sep. 17, 2002

(54) COLUMN FOR CHARGED PARTICLE BEAM DEVICE

(75) Inventor: Pavel Adamec, Haar (DE)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/293,482

(22) Filed: Apr. 15, 1999

(51) Int. Cl.⁷ .................................................. H01J 37/20
(52) U.S. Cl. .................................... 250/310; 250/396 R
(58) Field of Search ............................ 250/310, 396 R, 250/396 ML

(56) References Cited

U.S. PATENT DOCUMENTS

| | | | | |
|---|---|---|---|---|
| 3,657,593 A | * | 4/1972 | Garrood et al. | 250/310 |
| 4,999,496 A | * | 3/1991 | Shaw et al. | 250/310 |
| 5,606,261 A | * | 2/1997 | Golladay | 250/310 |
| 5,736,742 A | * | 4/1998 | Ochiai | 250/396 R |
| 5,981,947 A | * | 11/1999 | Nakasuji et al. | 250/310 |

* cited by examiner

Primary Examiner—Kiet T. Nguyen
(74) Attorney, Agent, or Firm—Sughrue Mion Zinn MacPeak & Seas LLP.

(57) ABSTRACT

A charged particle beam column comprises: a particle source; an objective lens; a pre-lens deflection unit for deflecting a beam of charged particles away from the optical axis on such a path that the combined action of the objective lens and the pre-lens deflection unit directs the beam of charged particles towards the optical axis to hit the specimen surface from a first direction; and an in-lens deflection unit arranged in the vicinity of the objective lens for redirecting the deflected beam of charged particles on such a path that the combined action of the objective lens and the in-lens deflection unit redirects the beam of charged particles towards the optical axis to hit the specimen surface under said large beam landing angle from a second direction substantially opposite to said first direction.

30 Claims, 6 Drawing Sheets

COLUMN FOR CHARGED PARTICLE BEAM DEVICE

FIELD OF THE INVENTION

This invention relates to a charged particle beam device for the examination of specimens. In particular, this invention relates to a beam column where the beam may land on the specimen surface at an oblique landing angle.

BACKGROUND OF THE INVENTION

In charged particle beam devices, such as a scanning electron microscope (SEM) the typical aperture angle as well as the typical landing angle of the charged particle beam is of the order of several millirads. For many applications it is desirable that the charged particle beam lands on the sample surface at a much larger angle of about 5° to 10°, corresponding to 90 to 180 millirads.

One application which requires such landing angles is the stereoscopic visualization of a specimen surface. Stereographic techniques using a SEM date back to the early developmental period of scanning electron microscopy. Since electrons can be collected from practically all parts of a relatively rough sample, a SEM image has a rather "real" appearance. The main reason for this real appearance is that the secondary electron signal produced at the point of beam impact varies with the local slope of the surface in the same way as the perceived brightness of the surface of a diffusely illuminated macroscopic object. Furthermore, variations in the efficiency with which this signal is collected by the weak electric field from the detector modifies the signal as a function of position such that it appears as if the sample surface contained shadows. While the images have thus all the visual cues of a conventional black and white photograph, these cues are in many situations deceptive. It is therefore essential that a method which provides authentic perspective information is available. Stereoscopic visualization is such a method. It is useful and sometimes indispensable for detecting and resolving situations where other coding mechanisms yield ambiguous results.

In another application, topographical information about the specimen surface may be extracted, for example, from the parallax between stereo pairs of images obtained with a tilted beam. A further application, three-dimensional imaging of a specimen, requires also a beam tilted by several degrees, see, e.g., U.S. Pat. No. 5,734,164.

In all these applications, the beam tilting mechanism plays a key role. In early solutions, a stereo effect was achieved by mechanically tilting the specimen to provide two perspectives. However, due to mechanical imperfections, a lateral movement of the specimen is inevitable, which often results in misregistrations between the elements of a stereo image pair. This problem is especially pertinent for highly regular structures such as an array of memory cells in an integrated circuit.

When beam tilting is carried out electrically, the fact that the specimen can remain horizontal is a significant advantage as far as the lateral coordinate registration is concerned. Electrical tilting is also much faster than its mechanical counterpart. The electrical method, however, also has certain drawbacks. In one method, the beam is deflected above the objective lens (pre-lens deflection) in such a way that each ray seems to emerge from a point coincident with the apparent position of the electron source (see FIG. 2). This way, each ray is focussed on the same area of the sample as long as the sample surface is in focus. However, as a consequence, the beam traverses the field of the objective lens considerably off-axis, with attendant degradations due to lens aberrations. In particular, chromatic aberrations limit the attainable resolution to several tens of nanometers. Many applications require a much higher resolution of about 5 nm.

If, as in another method, the deflection coils are arranged below the objective lens (post-lens deflection), the beam passes through the lens on the optical axis (FIG. 3). However, the physical dimensions of the coils below the final lens imposes a limit on the minimum attainable working distance, i.e., on the minimum attainable distance between the final lens and the specimen to be examined. An acceptable resolution is then not achieved due to the degraded instrument resolution arising from the enlarged working distance.

SUMMARY OF THE INVENTION

The present invention intends to overcome the above-mentioned drawbacks and disadvantages of the prior art. Specifically, the invention intends to provide an improved charged particle beam column allowing specimens to be examined with a large beam landing angle while maintaining a high resolution of the charged particle image.

Further advantageous features, aspects and details of the invention are evident from the dependent claims, the description and the accompanying drawings. The claims are intended to be understood as a first non-limiting approach to define the invention in general terms.

According to one aspect, the invention provides a column for directing a beam of charged particles onto a specimen surface under a large beam landing angle, the column comprising:

a particle source for providing the beam of charged particles propagating along an optical axis; an objective lens for focussing the beam of charged particles onto the specimen surface; a pre-lens deflection unit arranged between the particle source and the objective lens; the pre-lens deflection unit being adapted to deflect the beam of charged particles away from the optical axis on such a path that the combined action of the objective lens and the pre-lens deflection unit directs the beam of charged particles towards the optical axis to hit the specimen surface from a first direction; an in-lens deflection unit arranged in the vicinity of the objective lens such that the fields of the in-lens deflection unit and the objective lens overlap; the in-lens deflection unit being adapted to redirect the deflected beam of charged particles on such a path that the combined action of the objective lens and the in-lens deflection unit redirects the beam of charged particles towards the optical axis to hit the specimen surface under said large beam landing angle from a second direction substantially opposite to said first direction.

Preferably, the fields of the pre-lens deflection unit and the objective lens have substantially no overlap. It is further advantageous if the in-lens deflection unit and the objective lens have appreciable overlap.

As discussed above, pre-lens deflection leads to an off-axis path of the beam through the objective lens which gives rise to large chromatic aberrations. These chromatic aberrations have been found to be independent of the position of the deflecting system as long as the field of the deflector and the field of the objective lens do not overlap. When the deflection system is placed inside the field of the lens, the chromatic aberrations are reduced. The reduction can amount to 50% or more, if the deflection system is placed deep inside the field of the lens or even partly below the lens. However, the chromatic aberration of such an in-lens deflection system is still in the order of tens of nanometers and thus not acceptable for many applications.

It has surprisingly been found by the present inventors that the chromatic aberrations caused by pre-lens deflection can be compensated by an in-lens deflection in the opposite direction. The combined action of pre-lens deflection and in-lens deflection causes the charged particle beam to hit the sample surface from a direction substantially opposite to the direction from which the beam hits the sample when no in-lens deflection is carried out.

Without being bound to a particular theory, this effect is presently understood as follows: For example, the pre-lens deflection system alone may cause a chromatic aberration of 100 nm for a beam landing angle of 5°, and the in-lens deflection system alone may cause a chromatic aberration of 50 nm for a beam landing angle of 5°, i.e. one which is reduced by 50%. Exciting the pre-lens deflection system to tilt the beam by 5°, and the in-lens deflection system to tilt the beam by 10° in the opposite direction then leads to a net tilt angle of 5°.

The chromatic aberrations amount to 100 nm in both cases, albeit in opposite directions, such that these chromatic aberrations exactly compensate each other. A net beam landing angle of 5° at negligible chromatic aberrations results. Of course, the skilled person will appreciate that for different reduction factors of the in-lens system, other relative tilt angles may have to be chosen to achieve compensation. Further, the practice of the invention does not depend on a knowledge of the chromatic aberrations of the deflection systems. The deflection angles of the pre-lens and in-lens deflection system at which for a preselected beam landing angle minimum aberration is obtained may be extracted experimentally from the resulting images.

The invention thus has the advantage that large beam landing angles on the sample surface can be provided without the usual reduction in resolutions arising from large chromatic aberrations.

In a preferred embodiment, the pre-lens deflection unit and the in-lens deflection unit are adapted to provide a beam landing angle less than 25°, preferably between 3° and 15°, more preferably between 5° and 10°. In the example given above, a beam landing angle of 3° would be realized by exciting the pre-lens deflection system to tilt the beam by 3°, and by exciting the in-lens deflection system to tilt the beam by 6° in the opposite direction to achieve a net tilt angle of 3°.

In a further preferred embodiment, the pre-lens deflection unit comprises two deflectors adapted to deflect the beam of charged particle away from the optical axis to a path seeming to emerge from a point coincident with the apparent position of the particle source or, if applicable, to emerge from a point coincident with the apparent position of an intermediate image of the particle source.

In still a further preferred embodiment, the in-lens deflection unit comprises two deflectors adapted to redirect the deflected beam to cross the optical axis at the specimen surface.

Although the deflection system described so far can be used with any kind of objective lens, in a preferred aspect of the invention, the objective lens is a compound magnetic-electrostatic lens. Preferably, the electrostatic part of the compound magnetic-electrostatic lens is an electrostatic retarding lens. Using such a compound magnetic-electrostatic lens yields superior resolution at low acceleration energies, such as a few hundred electron volts in case of a SEM. Such low acceleration energies are desirable especially in modem semiconductor industry, to avoid charging and/or damaging of radiation sensitive specimens. In a preferred embodiment, the electrostatic retarding lens reduces the energy of a beam of electrons as charged particles to less then 5 keV, more preferably to less then 2 keV, most preferably to about or less than 1 keV.

In a preferred embodiment, the column comprises means for applying a potential difference between the specimen and a pole piece of the objective lens. An electrostatic retarding lens may thus be created between the specimen and a pole piece of the objective lens, without making additional electrodes necessary. The skilled person will appreciate, however, that additional electrodes may be present to supplement and/or modify the thus generated retarding field.

To obtain a sufficient tilt angle, the strength of the deflecting field of the in-lens deflection unit must be larger for an objective lens with a shorter focal length. In some cases this requirement on the in-lens deflection unit may prevent the use of strong objective lenses thereby limiting the achievable resolution of the objective lens in the standard imaging mode, i.e. in a mode where the column is operated without beam tilt.

To overcome this limitation, according to a further preferred aspect of the invention, the objective lens is a two-stage lens, comprising a lower lens with short focal length and an upper lens with larger focal length. If high resolution but no beam tilt is required, only the lower lens would be used. Due to its short focal length, high resolution is achieved. For large beam landing angles, only the upper, weaker lens would be used, resulting in a slightly worse resolution allowing large beam landing angles. As will be appreciated by the skilled person, both lenses may be used simultaneously with relative excitation strengths depending on the required combination of resolution and beam landing angle.

Preferably, the focal length of the lower lens is about or less then 10 mm, more preferably, the focal length of the lower lens is in the range between about 2 mm and about 5 mm. The focal length of the upper lens is preferably about or less than 40 mm, more preferably the focal length of the upper lens is in the range between about 10 mm and about 20 mm. In most cases the focal length of the upper lens will be larger than 3 mm.

In a further preferred embodiment, the in-lens deflection unit is arranged below the upper lens, proximal to the lower lens.

Instead of a two-stage lens with both stages arranged above the specimen, it may be advantageous to put a further strong magnetic lens below the specimen. In a mode with no beam tilt, high resolution may then be achieved. As will be appreciated by the skilled person, also in this case both lenses may be used simultaneously with relative excitation strengths depending on the required combination of resolution and beam landing angle. Also, the additional strong magnetic lens may be combined with a two-stage lens.

Preferably, the column further comprises means for scanning the beam of charged particles over the surface of the specimen.

The invention further comprises a method for directing a beam of charged particles onto a specimen surface under a large beam landing angle, the method comprising the steps of:

a) providing a beam of charged particles propagating along an optical axis;

b) focusing the beam of charged particles onto the specimen surface; whereby the method is characterized in further comprising the steps of c) selecting a beam landing angle;

d) deflecting the beam of charged particles propagating along the optical axis away from the optical axis, whereby the magnitude of the deflection is chosen such that the combined action of deflecting and focussing the beam directs the beam of charged particles to hit the specimen surface from a first direction;

the deflection causing a first contribution to the aberration on the specimen surface;

e) redirecting the deflected beam of charged particles, whereby the redirection is chosen such that the combined action of redirecting and focussing the deflected beam directs the beam of charged particles to his the specimen surface under said large beam landing angle from a second direction substantially opposite to said first direction;

the redirection causing a second contribution to the aberration on the specimen surface;

whereby the deflection in step d) and the redirection in step e) are chosen such that the total aberration on the specimen surface is minimized.

The deflection and redirection can be varied while keeping the beam landing angle constant. That way, the first and second contributions to the aberration can be varied without changing the beam landing angle. In the method according to an embodiment of the invention, the deflection and redirection is then adjusted to yield minimum (total) aberration on the sample surface at constant landing angle. In the framework of the above-mentioned theory this will be the case when the deflection and redirection are such that the first and second contribution to the aberration essentially compensate each other.

According to further aspect, the invention provides a column for directing a beam of charged particles onto a specimen under a large beam landing angle, the column comprising: a particle source for providing a beam of charged particles propagating along an optical axis; an objective lens for focussing the beam of charged particles onto the specimen; a pre-lens deflection unit for deflecting the beam of charged particles away from the optical axis, the pre-lens deflection unit being arranged between the particle source and the objective lens such that the fields of the pre-lens deflection unit and the objective lens have substantially no overlap; an in-lens deflection unit for redirecting the deflected beam of charged particles to the opposite side of the optical axis , the in-lens deflection unit being arranged in the vicinity of the objective lens such that the fields of the in-lens deflection unit and the objective lens have appreciable overlap, such that the combined action of the objective lens and the in-lens deflection unit directs the beam of charged particles back to the optical axis whereby the beam of charged particles hits the specimen under said large beam landing angle.

According to another aspect of the invention, a charged particle column having a defined optical axis is provided, the charged particle column comprising a charged particle source, an objective lens, a pre-lens deflection unit positioned between the source and the objective lens, an in-lens deflection unit proximal to the objective lens and, when activated, creating a deflection field overlapping a focussing field of the objective lens, wherein said pre-lens deflector is operable to deflect charged particles away from the optical axis, and said in-lens deflector is operable to deflect charged particles towards the optical axis.

BRIEF DESCRIPTION OF THE DRAWINGS

Some of the above indicated and other more detailed aspects of the invention will be described in the following description and partially illustrated with reference to the figures in which

FIG. 1b is a schematic top view on the specimen of the column of FIG. 1a;

In the figures, like reference numerals refer to like elements.

DESCRIPTION OF THE PREFERRED EMBODIMENTS

In the following, preferred embodiments of the invention are discussed which use electrons as charged particles. The invention is, however, not limited to the use of electrons but encompasses the use of protons, ions and other charged particles as well.

Figure 2:
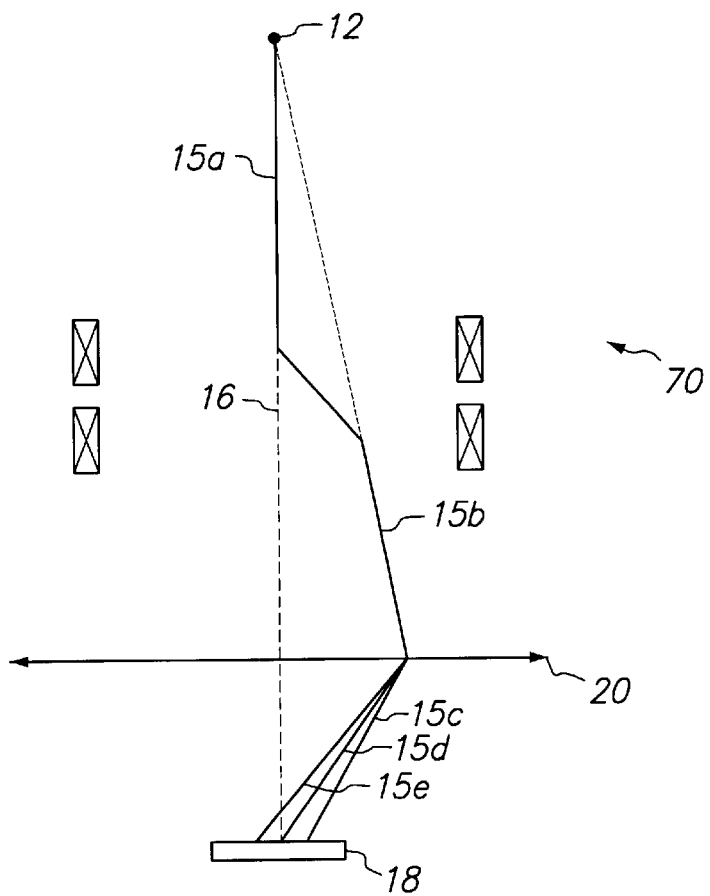
FIG. 2 is a schematic vertical cross section of a prior art beam column using a pre-lens deflection system.
Figure 3:
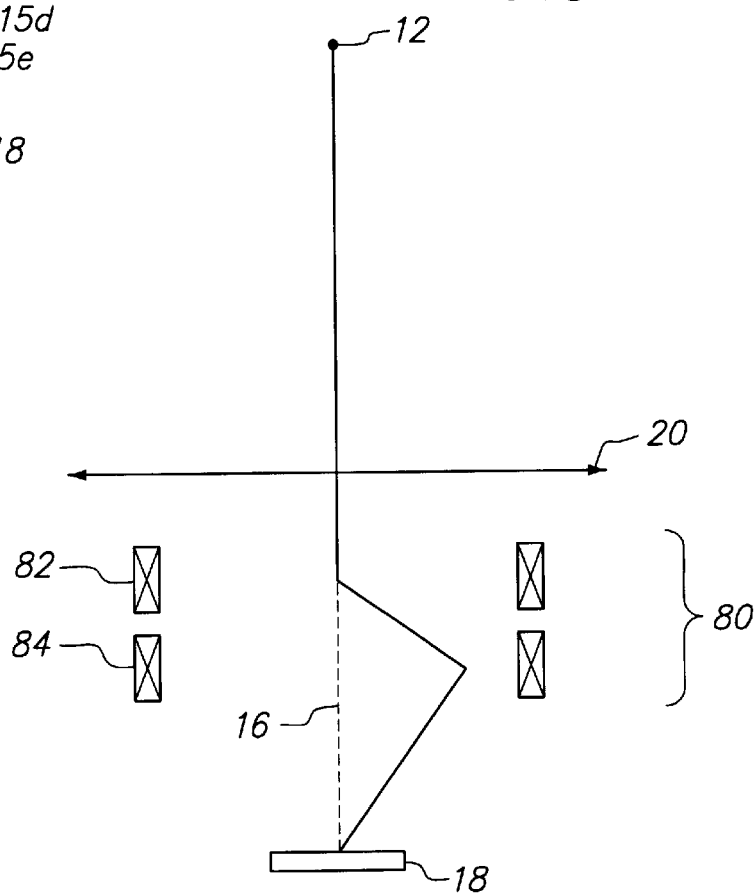
FIG. 3 is a schematic vertical cross section of a prior art beam column using a post-lens deflection system.

For a better understanding of the invention, typical problems associated with prior art designs in SEMs are illustrated in FIGS. 2 and 3. Generally, an electron beam is released from an electron source 12 and propagates along the optical axis 16 towards an objective lens 20. Elements such as the anode of the electron source, condenser lenses, apertures, scan coils, detectors and the like that are not important for under standing the present invention are omitted in the drawings, Objective lens 20 focuses the electron beam onto the surface of a specimen 18. The interaction of the electron beam with the specimen 18 generates secondary electrons which are collected and detected by a suitable detector (not shown).

In FIG. 2, a two-stage pre-lens deflection unit 70 deflects the beam from its path 15a along, the optical axis 16 to a path 15b which seems to emerge from a point coincident with the apparent position of the particle source 12. That way the deflected beam is focussed by the objective lens 20 on the same area of the sample for any deflection as long as the sample surface is in focus (ray 15d). Due to the deflection, the beam traverses the field of the objective lens considerably off-axis leading to large chromatic aberrations.

For an on-axis beam, the finite energy spread of the beam results in a disk of least confusion with diameter $d_c$, which can be written as $$d_c = C_c \alpha \Delta E/E, \quad (1)$$

where $C_c$ is the chromatic aberration coefficient, a is usually the convergence angle, and $\Delta E/E$ is the fractional variation in the electron-beam energy. Formula (1), which describes the chromatic aberration for an on-axis beam with convergence angle a, can also be used to describe a situation where the charged particle beam passes the lens off-axis. In this case, the convergence angle $\alpha$ has to be replaced by the beam landing angle in equation (1) and the length $d_c$ is a lateral extension of the elongated beam cross section. A large chromatic aberration arises as the beam landing angle is very large (several degrees) compared to typical convergence angles (a few tenths of a degree).

The effect is schematically shown in FIG. 2 by rays 15e, 15d and 15c representing electrons with energies E−ΔE, E, and E+ΔE, respectively. In designs as illustrated in FIG. 2, chromatic aberration blurs the image and limits the attainable resolution to several tens of nanometers.

FIG. 3 shows an alternative prior art design wherein deflection coils 82, 84 are arranged below the objective lens 20 to form a post-lens deflection system 80. After the beam passes through the objective lens 20, a first deflection coil 82 deflects the beam away from the optical axis and a second deflection coil 84 directs the beam back to the optical axis to hit the sample under the desired beam landing angle. As the beam passes the objective lens 20 on the optical axis 16, the resolution is not degraded by the off-axis aberration of the lens. However, the physical dimensions of the coils below the final lens 20 impose a limit on the minimum working distance attainable, requiring objective lenses with larger focal lengths. The larger focal length then gives rise to increased chromatic as well as to increased spherical aberrations. Accordingly, solutions as illustrated in FIG. 3, also do not achieve acceptable image resolutions.

Figure 1A:
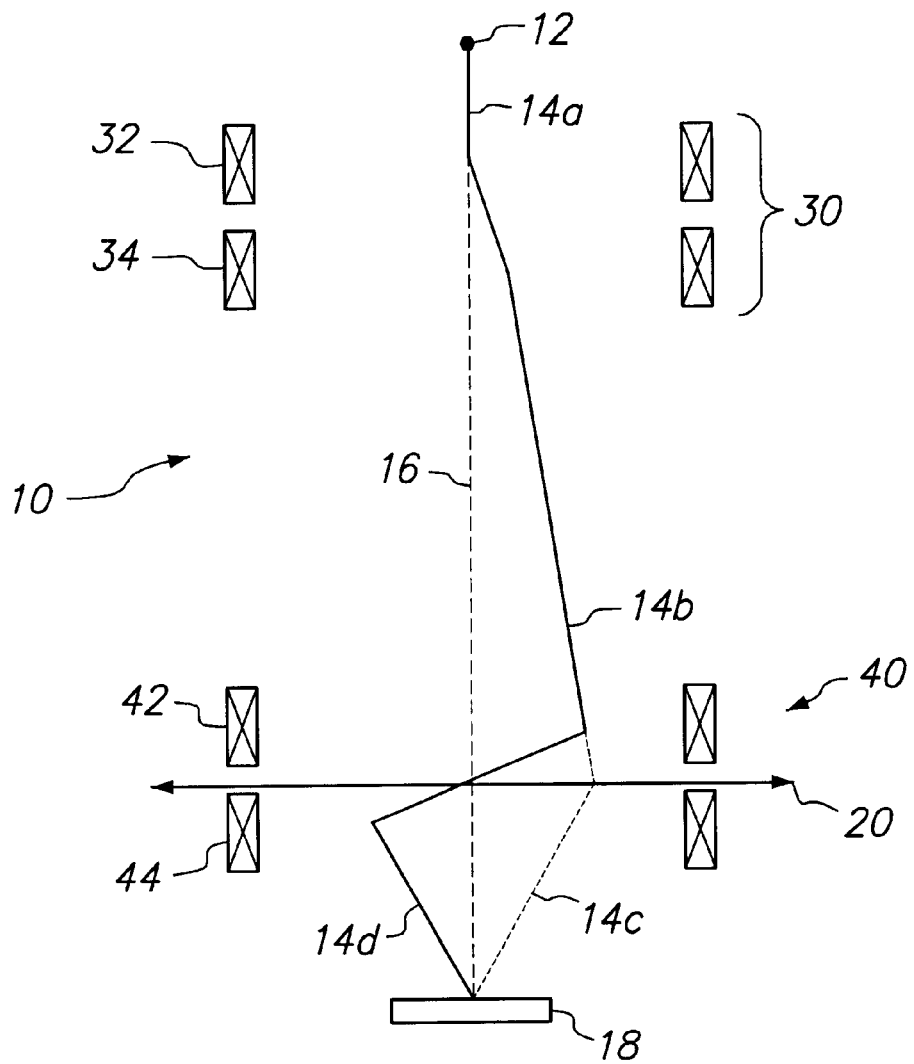
FIG. 1a is a schematic vertical cross section of a beam column according to an embodiment of the invention.

FIG. 1a illustrates a particular embodiment of a column according to the invention, generally represented by the reference numeral 10. As before, an electron beam is released from an electron source 12 and propagates on a path 14a along the optical axis 16 towards an objective lens 20 which focuses the beam onto the surface of a specimen 18. The pre-lens deflection unit 30 comprises two deflection coils 32, 34 to deflect the beam from the optical axis 16 to a path 14b which seemingly emerges from a point coincident with the apparent position of the electron source 12. Depending on the design of the column, reference sign 12 may represent the electron source itself or an intermediate image of the electron source.

The pre-lens deflection unit 30 is arranged between the electron source 12 (or an intermediate image thereof) and the objective lens 20 such that there is practically no overlap between the respective fields. The chromatic aberration produced by the pre-lens deflection unit 30 is then independent of the position of the pre-lens deflection unit 30 and is roughly proportional to the chosen beam landing angle. In the embodiment shown in FIG. 1a, the chromatic aberration produced by the pre-lens deflection unit 30 was 100 nm per 5° tilt angle. If only the pre-lens deflection unit 30 but not the in-lens deflection unit 40 is used, the electron beam follows a path as schematically represented by reference sign 14c, hitting the specimen surface from a first direction. In the top view of the specimen of FIG. 1b, the projection of this first direction onto the specimen surface is illustrated by arrow 14c.

When a deflection system is placed inside the field of the objective lens such that the respective fields overlap, the chromatic aberration is reduced. By placing the deflection system deep inside or slightly below the objective lens, reductions of 50% or even more have been achieved. In the embodiment shown schematically in FIG. 1a an additional deflection system, namely the in-lens deflection unit 40 was placed such that the chromatic aberration was reduced by 50%. Thus, the chromatic aberration of the in-lens deflection unit 40 was only 50 nm per 5° tilt angle.

The in-lens deflection unit 40 is a two-stage unit comprising deflection coils 42 and 44. While the schematic sketch of FIG. 1a shows an arrangement where one of the coils is positioned above and one coil is positioned below the principal plane of the objective lens 20, other arrangements are also possible as long as there is an overlap between the fields of the deflection unit 40 and the objective lens 20. It is preferred that the overlap between the respective fields be made as large as possible.

Figure 1B:
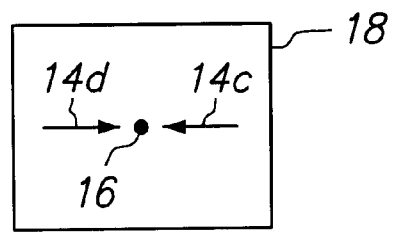

The present inventors have observed that the chromatic aberrations which result from the off-axis path of the beam due to the deflection by the pre-lens deflection unit 30 can be compensated by the use of the in-lens deflection unit 40. As mentioned above, without the in-lens deflection unit 40, the electron beam follows path 14c, hitting the specimen surface from a first direction. Now, the in-lens deflection unit 40 redirects the beam so that it takes a path schematically represented by reference sign 14d in FIG. 1a. The redirection is such that the electron beam hits the surface of the specimen from a second direction which is substantially opposite to the first direction. FIG. 1b shows a projection of the second direction onto the specimen surface, illustrated by arrow 14d. While it may appear from FIG. 1a that the path 14d crosses the optical axis 16 close to the main plane of the objective lens 20, this need not always be the case.

As the in-lens deflection unit 40 is inside the field of the objective lens 20, it is not the action of the in-lens deflection unit 40 alone, but the combined action of the in-lens deflection unit 40 and the objective lens 20 that directs the beam back to the optical axis such that it hits the sample under the preselected landing angle. Since the field of the objective lens 20 and the in-lens deflection unit 40 overlap considerably, their contributions to the beam bending cannot be separated graphically in FIG. 1a. For illustration, FIG. 1a shows the beam path in a simplified manner, as if its deflection were only due to the in-lens deflection unit 40.

The beam paths shown in FIGS. 1 to 3 are further simplified in that they do not show the rotation of the beam caused by magnetic lenses. These effects are not shown, as they are difficult to depict in a two-dimensional drawing and because the skilled person is well aware of theses additional effects. Also, these effects are not important for an understanding of the present invention.

Without being bound to a particular theory, it is presently thought that the compensation of the chromatic aberration can be explained as follows:

If a net beam landing angle of 5° is desired, the pre-lens deflection unit 30 is excited to a level which would lead to a landing angle of 5° coming from a first direction if the in-lens deflection unit 40 is not activated. In FIG. 1a, the beam would then follow path 14c and land on the specimen under an angle of 5° coming from the right (also shown in FIG. 1b).

Then, the-in-lens deflection unit 40 is excited to a level which would lead to a landing angle of 10° coming from a second direction, substantially opposite to the first direction, if the pre-lens deflection unit 30 would not be activated. Both deflecting units 30, 40 together then give rise to path 14d and to the desired landing angle of 10°−5°=5°, coming from the second direction (also shown in FIG. 1b). With the values of the chromatic aberrations mentioned above, the chromatic aberrations introduced are:

100 nm in the first direction (100 nm/5° at an angle of 5°) and 100 nm in the second, opposite direction (50 nm/5° at an angle of 10°).

Since the aberrations are equal and in opposite directions, they compensate each other.

It is clear that for different values of the chromatic aberrations of the deflection units, other tilt angles have to be chosen to achieve the same beam landing angle. If, for example, the pre-lens deflection unit has an aberration of 100 nm/5° and the in-lens deflection unit has an aberration of 60 nm/5°, the tilt angles should be 7.5° and 12.5°, respectively. The beam landing angle is then 12.5°−7.5°=5°, and the chromatic aberrations are compensated (100 nm/5°*7.5°=150 nm in one direction, 60 nm/5°*12.5°=150 nm in the opposite direction).

It should be emphasized that the practice of the invention does not rely on the correctness or a knowledge of the above-mentioned mechanism. Especially, the aberrations of the pre-lens and in-lens deflection units 30, 40 and the tilt angles mentioned above do not have to be known. For the invention, it is sufficient that the in-lens deflection unit 40 redirects the beam so that it lands from a direction substantially opposite to the first direction (i.e. the direction under which the beam would hit the surface of the specimen without the in-lens deflection unit) and that the field of the in-lens deflection unit 40 overlaps with the field of the objective lens 20, while the field of the pre-lens deflection unit 30 does not. The aberration of the in-lens deflection unit 40 is then reduced compared to the pre-lens deflection unit 30 and for any preselected beam landing angle there exist tilt angles which lead to a compensation of the chromatic aberrations. The specific excitations at which the desired landing angle at maximum compensation is achieved can be extracted experimentally from the images obtained.

From the above examples it is clear that the in-lens deflection unit 40 must deflect by a larger angle if its chromatic aberration is closer to the chromatic aberration of the pre-lens deflection unit 30. Therefore, it is preferred that the in-lens deflection unit 40 is positioned deep inside or even slightly below the field of the objective lens 20 such that their respective fields overlap considerably.

While the figures show the pre-lens deflection unit 30 to comprise two deflection coils 32, 34, it is also possible to use a pre-lens deflection unit 30 consisting of a single deflector only, for example, in a case where reference sign 12 represents an intermediate image of an electron source. Advantageously, the single deflector is then placed approximately at the height of the intermediate image. This single deflector is then sufficient to deflect the beam away from the optical axis 16 to a path which seems to emerges from the intermediate image of the electron source.

Figure 4:
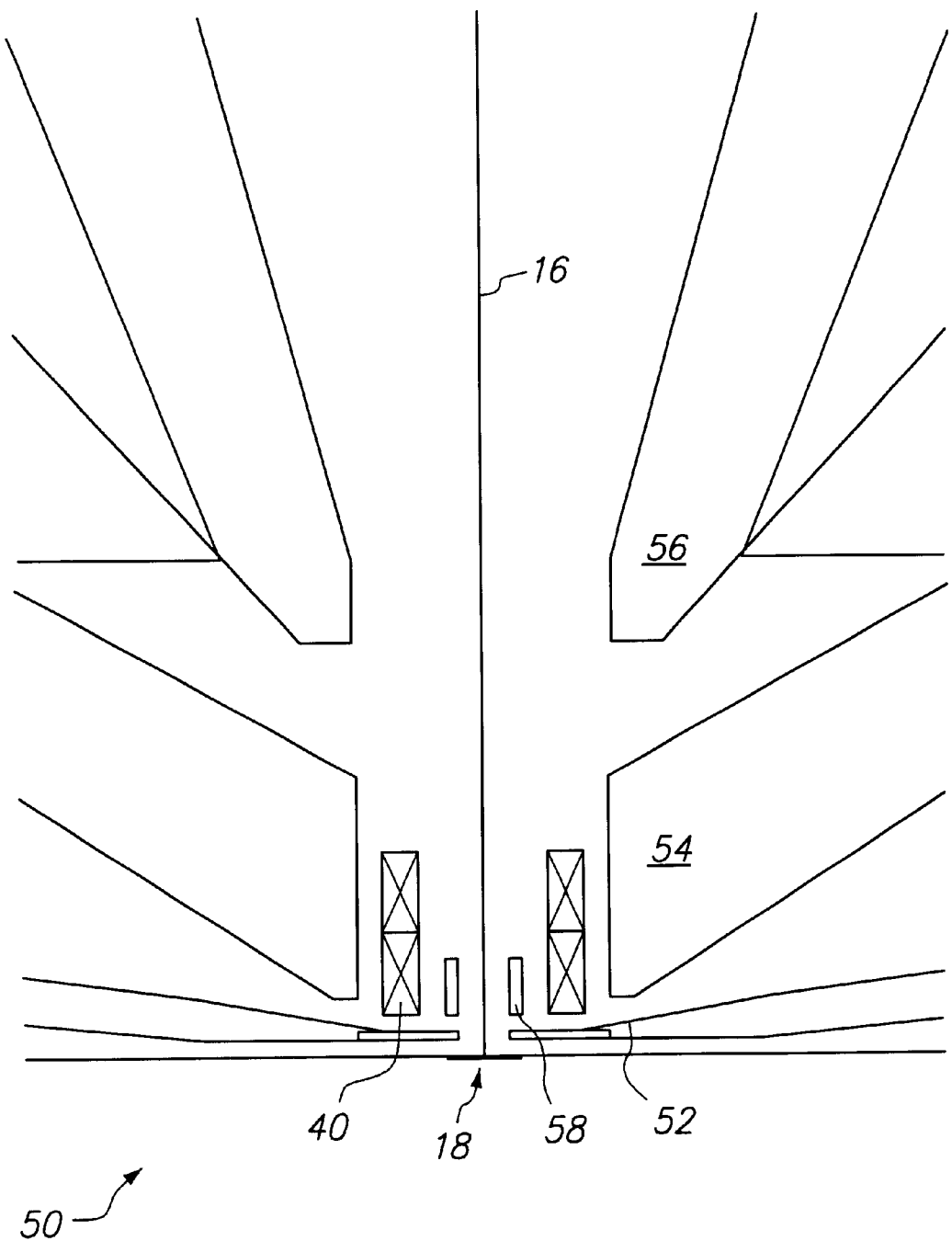
FIG. 4 is an enlarged view of a two-stage objective lens according to an embodiment of the invention.

Another embodiment of the invention is discussed with respect to FIG. 4. This figure shows in greater detail an objective lens 50 which allows two imaging modes:

It has been found that the strength of the deflecting field of the in-lens deflection unit 40 has to be increased if objective lenses with shorter focal lengths are used. In some applications it is beneficial to work with an objective lens with a very short focal length. This would require an in-lens deflection unit having a very large deflecting field. However, the maximum strength of the field of an in-lens deflection unit is limited, which in turn demands that the focal length of the objective lens be larger than a certain value, which is often larger than desired. This is, because the achievable resolution of such a rather weak objective lens in the standard imaging mode, i.e. in a mode when no beam tilt is needed, may be limited to about 5 nm.

The objective lens 50 of FIG. 4 overcomes this problem by providing two imaging modes: a high resolution imaging mode for cases where a beam tilt is not required, and a beam tilt mode with reduced resolution.

Objective lens 50 is a combined magnetic-electrostatic lens which leads to superior resolution at low acceleration energies. Its magnetic lens is a two-stage lens comprising a lower lens with short focal length formed by pole pieces 52 and 54 and an upper lens with larger focal length formed by pole pieces 54 and 56. Its electrostatic lens for decelerating the particle beam is formed by the electrode 58 and the lower pole piece 52 of the lower magnetic lens.

If high resolution is desired and no beam tilt is needed, only the lower lens 52, 54 is used. Due to its small focal length a resolution of about 2 nm is achieved. The in-lens deflection coils 40 can in this case be used as scan coils or as shift coils.

On the other hand, if a large beam landing angle is needed, the upper lens 54, 56 is used. Being weaker, the constraints on the deflection fields of the deflection unit 40 are easily met.

In this mode, large beam landing angles can be achieved at the cost of a slightly worse resolution (about 4 nm). Of course, both lenses may by used simultaneously to produce results lying between the above extremes in a tradeoff between high resolution and large landing angle.

Further embodiments of objective lenses implementing features of the invention are shown in FIGS. 5 to 10. As can be understood, any of the described lenses can be used as objective 20 shown in FIG. 1*a*.

Figure 5:
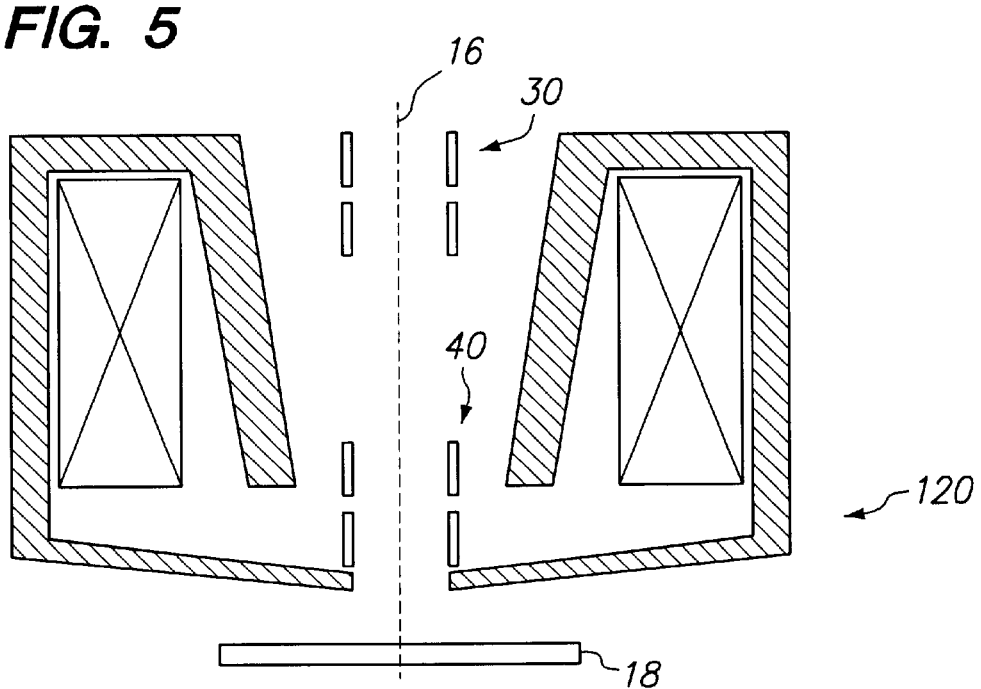
FIGS. 5–10 show vertical cross sections of the lower part of beam columns according to further advantageous embodiments of the invention.

In FIG. 5, the objective lens 120 is a single stage purely magnetic lens. The magnetic lens may be combined with an electrostatic lens, preferably an electrostatic retarding lens for improved resolution at very low energies of about or below 2 keV. The electrostatic retarding field may be created between the objective lens 120 and the specimen 18 by applying a potential to one of those, usually to the specimen 18.

Figure 6:
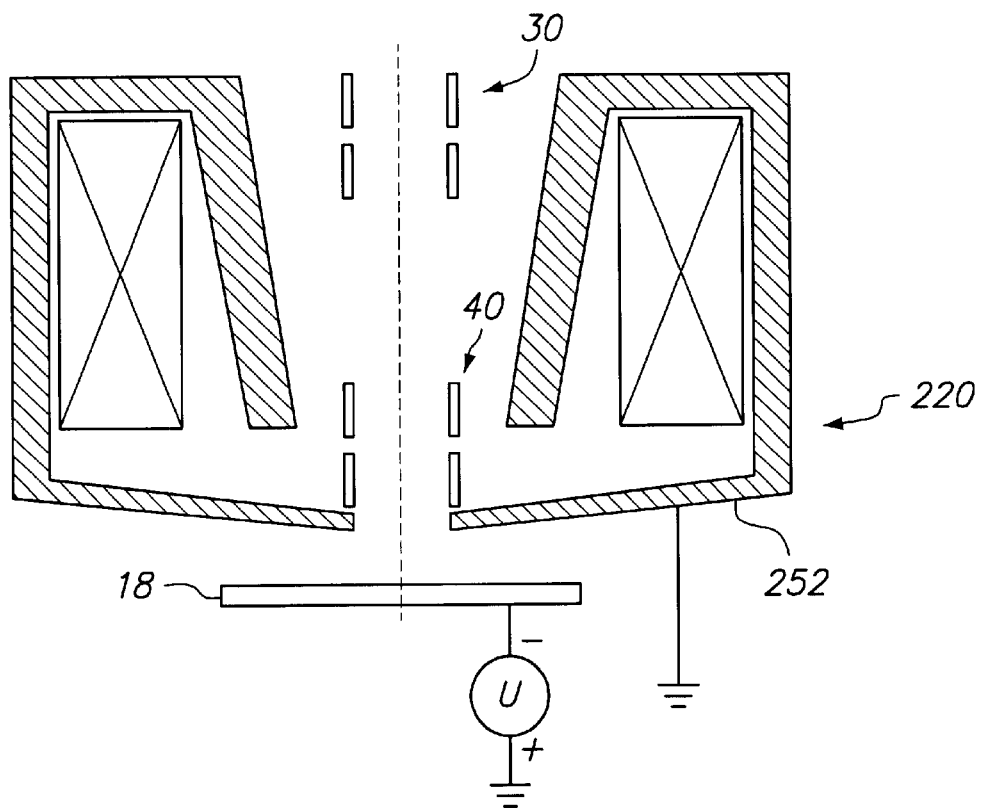

In the embodiment of FIG. 6 a negative potential U is applied to the specimen, while a pole piece 252 of the objective lens 220 is grounded. For a beam energy inside the focusing magnetic lens of, for example, between 2 and 20 keV, the negative potential U is, for example, between 2 and 20 kV, resulting in a landing energy between 10 eV and 2 keV. This low landing energy improves the focusing properties of the lens and the image resolution.

Figure 7:
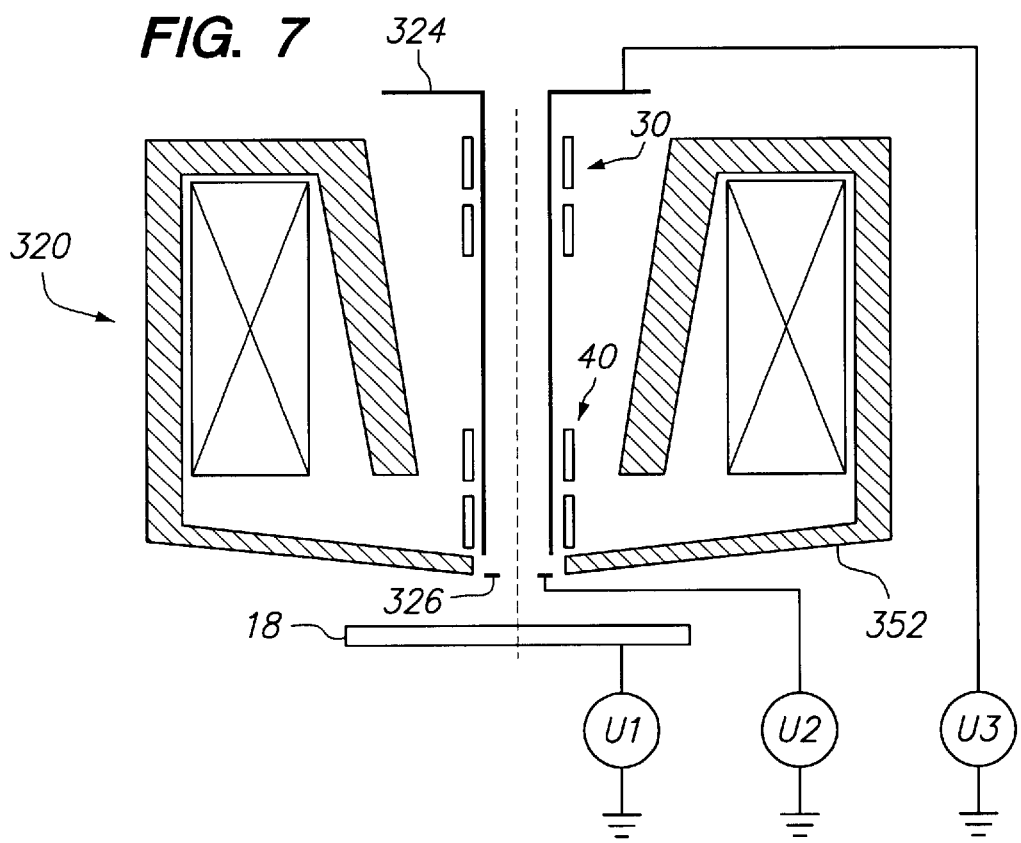

Further embodiments are illustrated with respect to objective lens 320 in FIG. 7, wherein the potential U1 applied to the specimen 18 and potential U2 applied to the electrode 326 are optional. In one case, electrodes 324, 326 and corresponding potentials U2 and U3 are present and form an electrostatic lens generating a retarding field decelerating the electron beam above the sample. Potential U3 is, for example, between 2 and 20 kV, and potential U2 is, for example, between 0 and 5 kV. If, in a second case, an additional potential U1 is applied to the specimen, it may be varied between −5 kV and 5 kV.

Electrode 326 and potential U2 are not required, but, if present, provide improved control of the field at the specimen surface.

Figure 8:
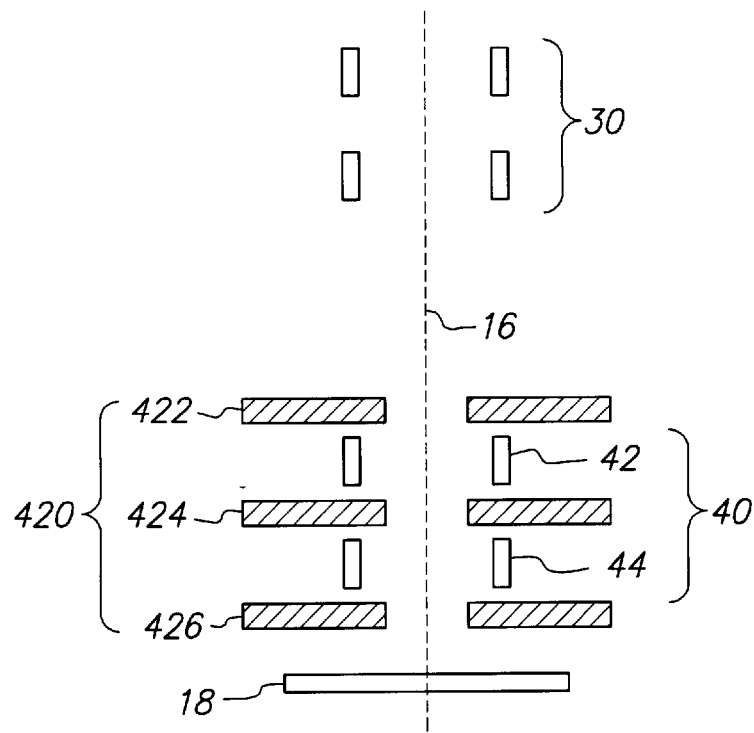

FIG. 8 illustrates the use of the pre- and in-lens deflection system with an electrostatic three electrode (422, 424, 426) objective lens 420. The in-lens deflection unit 40 comprises two deflectors 42, 44, each arranged between two of the electrodes (422, 424 and 424, 426) of the objective lens 420. In an alternate embodiment, the electrodes 422, 424, 426 are split into segments, and the in-lens deflection unit is formed by a subset of the lens segments.

Figure 9:
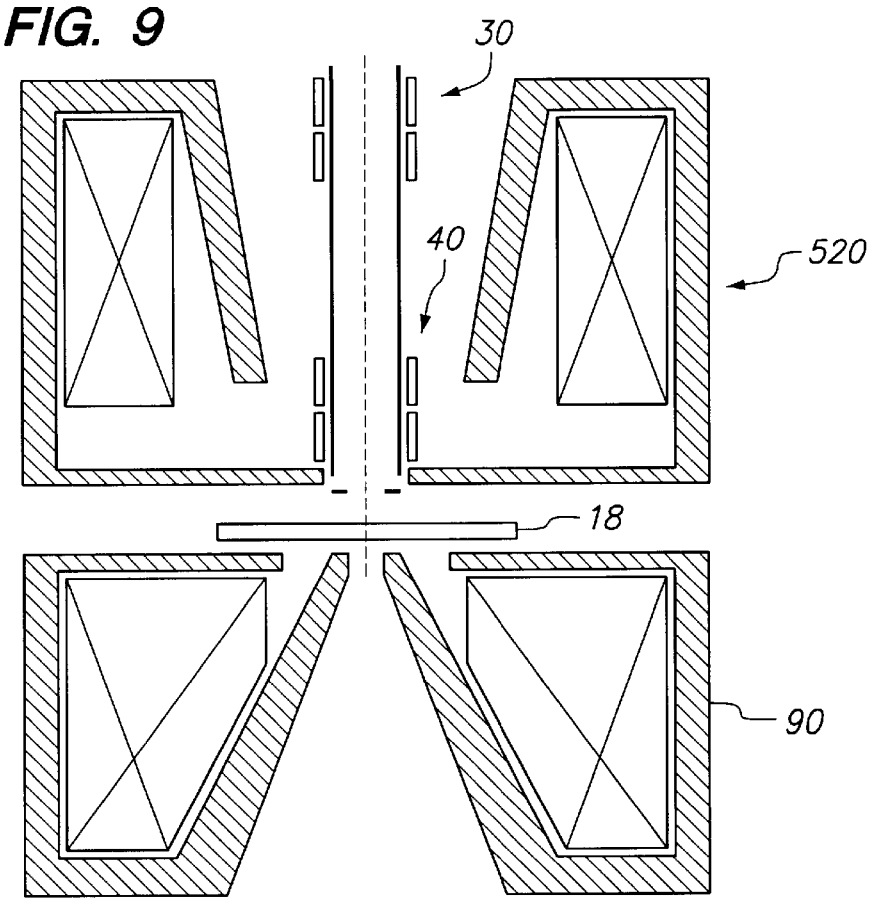

FIG. 9 shows a column with an objective lens 520 as in FIG. 7, but wherein a further strong magnetic lens 90 is placed below the specimen 18 to achieve high resolution in the operating mode without beam tilt. Of course, as discussed in connection with FIG. 4, the strong magnetic lens 90 may also be operated in a mode with beam tilt to achieve a tradeoff between high resolution and large beam landing angle.

Figure 10:
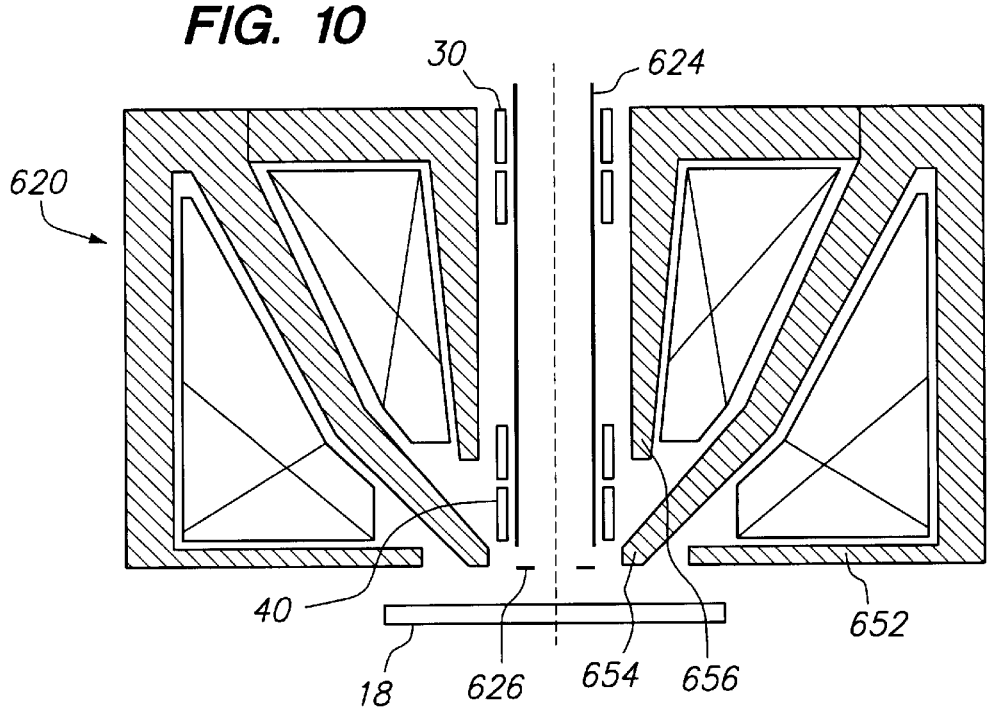

FIG. 10 shows a configuration similar to that of FIG. 4, with a two-stage compound magnetic-electrostatic objective lens 620. An electrostatic retarding lens is formed by the electrodes 624, 626 yielding improved resolution at low energies around and below 2 keV. The magnetic lens is a two-stage lens with a lower lens formed by the pole pieces 652 and 654, and an upper lens formed by the pole pieces 654, 656. In this embodiment, the lower lens has a focal length of, for example, 4 mm while the upper lens has a focal length of, for example, 15 mm. This column is operated as described in connection with FIG. 4 above.

What is claimed is:

1. A column for directing a beam of charged particles onto a specimen surface under an oblique beam landing angle, the column comprising:
   a particle source for providing the beam of charged particles propagating along an optical axis;
   an objective lens for focussing the beam of charged particles onto the specimen surface;
   a pre-lens deflection unit arranged between the particle source and the objective lens;
   the pre-lens deflection unit deflecting the beam of charged particles away from the optical axis on such a path that the objective lens and the pre-lens deflection unit direct the beam of charged particles towards the optical axis to hit the specimen surface in a first direction;
   an in-lens deflection unit arranged in the vicinity of the objective lens such that fields of the in-lens deflection unit and the objective lens overlap;
   the in-lens deflection unit redirecting the deflected beam of charged particles on such a path that the objective lens and the in-lens deflection unit redirect the beam of charged particles towards the optical axis to hit the specimen surface under said oblique beam landing angle in a second direction substantially opposite to said first direction.

2. The column according to claim 1, wherein the pre-lens deflection unit and the in-lens deflection unit provide a beam landing angle less than 25°.

3. The column according to claim 2, wherein the pre-lens deflection unit and the in-lens deflection unit provide a beam landing angle between 3° and 15°.

4. The column according to claim 2, wherein the pre-lens deflection unit and the in-lens deflection unit provide a beam landing angle between 5° and 10°.

5. The column according to claim 1, wherein the pre-lens deflection unit comprises two deflectors deflecting the beam of charged particles away from the optical axis to a path from a point coincident with an apparent position of the particle source or with an intermediate image of the particle source.

6. The column according to claim 1, wherein the in-lens deflection unit comprises two deflectors redirecting the deflected beam to cross the optical axis at the specimen surface.

7. The column according to claim 1, wherein the objective lens is a compound magnetic-electrostatic lens.

8. The column according to claim 7, further comprising means for applying a potential difference between the specimen and a pole piece of the objective lens.

9. The column according to claim 7, wherein an electrostatic part of the compound magnetic-electrostatic lens is an electrostatic retarding lens.

10. The column according to claim 9; wherein a retarding field of the electrostatic retarding lens is generated in a vicinity of the surface of the specimen.

11. The column according to claim 10, wherein the in-lens deflection unit comprises a lower deflector, and wherein a deflection field of the lower deflector of the in-lens deflection unit and a field of the electrostatic retarding lens overlap.

12. The column according to claim 9, wherein a retarding field of the electrostatic retarding lens is generated directly above the surface of the specimen.

13. The column according to claim 12, wherein the in-lens deflection unit comprises a lower deflector, and wherein a deflection field of the lower deflector of the in-lens deflection unit and a field of the electrostatic retarding lens overlap.

14. The column according to claim 9, wherein a retarding field of the electrostatic retarding lens is generated by applying a potential difference between the specimen and the pole piece of the objective lens.

15. The column according to claim 1, wherein the objective lens is a two-stage lens, comprising a lower lens with short focal length and an upper lens with larger focal length.

16. The column according to claim 15, wherein the focal length of the lower lens is about or less than 10 mm.

17. The column according to claim 16, wherein the focal length of the lower lens is between about 2 mm and about 5 mm.

18. The column according to claim 15, wherein the focal length of the upper lens is about or less than 40 mm.

19. The column according to claim 18, wherein the focal length of the upper lens is between about 10 mm and about 20 mm.

20. The column according to claim 15, wherein the in-lens deflection unit is arranged below the upper lens, proximal to the lower lens.

21. The column according to claim 1, further comprising a strong magnetic lens arranged below the specimen.

22. The column according to claim 1, further comprising means for scanning the beam of charged particles over the specimen surface.

23. The column according to claim 1, wherein the in-lens deflection unit comprises two deflectors.

24. The column according to claim 23, herein the two deflectors of the in-lens deflection unit, comprising an upper deflector and a lower deflector, are located at different positions along the optical axis.

25. The column according to claim 24, wherein a deflection field of the lower deflector of the in-lens deflection unit and the field of the electrostatic retarding lens overlap.

26. The column according to claim 24, wherein the lower deflector of the in-lens deflection unit is a magnetic deflector.

27. The column according to claim 26, wherein the lower deflector of the in-lens deflection unit is formed by a polepiece made from soft magnetic material around the optical axis.

28. A method for directing a beam of charged particles onto a specimen surface under a large beam landing angle, the method comprising the steps of:
   a) providing a beam of charged particles propagating along an optical axis;
   b) focussing the beam of charged particles onto the specimen surface;
   c) selecting a beam landing angle;
   d) deflecting the beam of charged particles propagating along the optical axis away from the optical axis,
      whereby the magnitude of the deflection is chosen such that deflecting and focussing the beam directs the beam of charged particles to hit the specimen surface in a first direction,
      the deflection causing a first contribution to the aberration on the specimen surface;

e) redirecting the deflected beam of charged particles,
whereby the redirection is chosen such that redirecting and focussing the deflected beam directs the beam of charged particles to hit the specimen surface under said large beam landing angle in a second direction substantially opposite to said first direction;
the redirection causing a second contribution to the aberration on the specimen surface;

whereby the deflection in step d) and the redirection in step e) are chosen such that the total aberration on the specimen surface is minimized.

29. A charged particle column providing oblique beam landing angles on a specimen, comprising:
a charged particle source providing a beam of charged particles propagating along an optical axis,
an objective lens creating a focusing field;
a pre-lens deflection unit positioned between the particle source and the objective lens and, when energized, deflecting the beam of charged particles away from the optical axis in a first direction; and
an in-lens deflection unit;
wherein, when energized, said in-lens deflection unit creates a deflection field at least partially overlapping the focusing field, and deflecting the particle beam at an inflection point with respect within the focusing field, and wherein the deflection field together with the focusing field deflect the beam in a direction opposite the first direction and, after the beam has crossed the optical axis, redirect the beam so as to hit the specimen substantially at an intersection of the optical axis and the specimen.

30. The charged particle column of claim 29, wherein the inflection point is about the intersection of the optical axis and focusing plane of the focusing field.

\* \* \* \* \*